US011201036B2

(12) United States Patent
Ma et al.

(10) Patent No.: US 11,201,036 B2
(45) Date of Patent: Dec. 14, 2021

(54) PLASMA STRIP TOOL WITH UNIFORMITY CONTROL

(71) Applicants: Mattson Technology, Inc., Fremont, CA (US); Beijing E-Town Semiconductor Technology, Co., LTD, Beijing (CN)

(72) Inventors: Shawming Ma, Sunnyvale, CA (US); Vladimir Nagorny, Tracy, CA (US); Dixit V. Desai, Pleasanton, CA (US); Ryan Pakulski, Discovery Bay, CA (US)

(73) Assignees: Beijing E-Town Semiconductor Technology Co., LTD, Beijing (CN); Mattson Technology, Inc., Fremont, CA (US)

( * ) Notice: Subject to any disclaimer, the term of this patent is extended or adjusted under 35 U.S.C. 154(b) by 217 days.

(21) Appl. No.: 15/888,257

(22) Filed: Feb. 5, 2018

(65) Prior Publication Data

US 2018/0358210 A1 Dec. 13, 2018

Related U.S. Application Data

(60) Provisional application No. 62/610,588, filed on Dec. 27, 2017, provisional application No. 62/517,365, filed on Jun. 9, 2017.

(51) Int. Cl.
*H01J 37/32* (2006.01)
*H01L 21/67* (2006.01)

(52) U.S. Cl.
CPC .. *H01J 37/32522* (2013.01); *H01J 37/32422* (2013.01); *H01J 37/32513* (2013.01);
(Continued)

(58) Field of Classification Search
CPC ............... H01J 37/321; H01J 37/32119; H01J 37/32513; H01J 37/32724;
(Continued)

(56) References Cited

U.S. PATENT DOCUMENTS 5,226,967 A  7/1993 Chen et al.
5,567,243 A  10/1996 Foster et al.
(Continued)

FOREIGN PATENT DOCUMENTS

JP  2013098172  5/2013
WO  WO 2016171451  10/2016

OTHER PUBLICATIONS

PCT International Search Report and Written Opinion for corresponding PCT Application No. PCT/US2018/020103 dated Jun. 14, 2018, 14 pages.
(Continued)

*Primary Examiner* — Benjamin Kendall
*Assistant Examiner* — Kurt Sweely
(74) *Attorney, Agent, or Firm* — Dority & Manning, P.A.

(57) ABSTRACT

Plasma strip tools with process uniformity control are provided. In one example implementation, a plasma processing apparatus includes a processing chamber, a first pedestal in the processing chamber operable to support a workpiece, and a second pedestal in the processing chamber operable to support another workpiece. The first pedestal can define a first processing station. The second pedestal can define a second processing station. The apparatus can further include a first plasma chamber disposed above the first processing station and a second plasma chamber disposed above the second processing station. The first plasma chamber can be associated with a first inductive plasma source. The first plasma chamber can be separated from the processing chamber by a first separation grid. The second plasma
(Continued)

chamber can be associated with a second inductive plasma source. The second plasma chamber can be separated from the processing chamber by a second separation grid.

13 Claims, 10 Drawing Sheets

(52) U.S. Cl.
CPC .. *H01J 37/32715* (2013.01); *H01J 37/32816* (2013.01); *H01J 37/32834* (2013.01); *H01J 37/32899* (2013.01); *H01L 21/6719* (2013.01); *H01L 21/67069* (2013.01); *H01J 37/321* (2013.01)

(58) Field of Classification Search
CPC ........... H01J 37/32899; H01J 37/32834; H01J 37/32522; H01J 37/32816; H01J 37/32422; H01J 37/32715; H01J 37/68707; H01J 37/3244; H01J 37/32623; H01J 2237/002; H01J 37/320832; H01J 37/32091; H01J 37/3211; H01J 37/32431; H01J 37/32467; H01L 21/67207; H01L 21/67069; H01L 21/67109; H01L 21/68741; H01L 21/6719; C23C 16/4411; C23C 16/4412; C23C 16/4586; C23C 16/45544; C23C 16/45572; C23C 16/488
See application file for complete search history.

(56) References Cited

U.S. PATENT DOCUMENTS

| | | | | |
|---|---|---|---|---|
| 5,811,022 | A | * | 9/1998 | Savas .................. H01J 37/321 118/723 I |
| 5,838,121 | A | * | 11/1998 | Fairbairn .......... H01L 21/67742 318/45 |
| 5,897,713 | A | | 4/1999 | Tomioka |
| 5,906,683 | A | * | 5/1999 | Chen .................... C23C 16/455 118/715 |
| 6,013,155 | A | | 1/2000 | McMillin |
| 6,286,451 | B1 | | 9/2001 | Ishikawa |
| 6,287,643 | B1 | | 9/2001 | Powell et al. |
| 6,388,383 | B1 | | 5/2002 | Ni |
| 6,635,117 | B1 | * | 10/2003 | Kinnard ............ C23C 16/45561 118/723 R |
| 6,962,644 | B2 | * | 11/2005 | Paterson ........... H01J 37/32082 118/719 |
| 8,077,460 | B1 | * | 12/2011 | Dede ........................ F28F 3/12 361/699 |
| 8,617,347 | B2 | * | 12/2013 | Kim .................... C23C 16/4412 118/715 |
| 8,920,600 | B2 | | 12/2014 | Godyak |
| 8,980,763 | B2 | | 3/2015 | Wang et al. |
| 9,214,319 | B2 | | 12/2015 | Nagorny et al. |
| 2001/0003271 | A1 | | 6/2001 | Otsuki |
| 2002/0023899 | A1 | | 2/2002 | Khater |
| 2002/0170678 | A1 | | 11/2002 | Hayashi |
| 2002/0185226 | A1 | | 12/2002 | Lea |
| 2003/0015293 | A1 | | 1/2003 | Obuchi |
| 2004/0118519 | A1 | * | 6/2004 | Sen .................. H01J 37/3244 156/345.33 |
| 2005/0026436 | A1 | | 2/2005 | Hogan et al. |
| 2005/0211170 | A1 | | 9/2005 | Hanawa et al. |
| 2006/0005856 | A1 | | 1/2006 | Sun et al. |
| 2008/0093341 | A1 | | 4/2008 | Turlot et al. |
| 2008/0156440 | A1 | | 7/2008 | Sago |
| 2008/0178805 | A1 | | 7/2008 | Paterson et al. |
| 2008/0210378 | A1 | | 9/2008 | Lee |
| 2009/0028761 | A1 | * | 1/2009 | Devine ............... H01L 21/6719 422/186.04 |
| 2010/0247809 | A1 | | 9/2010 | Neal |
| 2011/0014397 | A1 | | 1/2011 | Yang |
| 2012/0006490 | A1 | | 1/2012 | Yamamoto et al. |
| 2012/0074126 | A1 | | 3/2012 | Bang et al. |
| 2014/0166616 | A1 | | 6/2014 | Shanker |
| 2014/0190635 | A1 | | 7/2014 | Lee et al. |
| 2014/0197136 | A1 | | 7/2014 | Nagorny et al. |
| 2014/0320017 | A1 | | 10/2014 | Chae |
| 2015/0060013 | A1 | * | 3/2015 | Buchberger, Jr. ... H01L 21/6831 165/64 |
| 2015/0072538 | A1 | | 3/2015 | Spulin |
| 2015/0083582 | A1 | | 3/2015 | Dhindsa et al. |
| 2015/0118862 | A1 | | 4/2015 | Reilly |
| 2015/0147488 | A1 | | 5/2015 | Choi |
| 2015/0197853 | A1 | | 7/2015 | Ishibashi |
| 2015/0221479 | A1 | * | 8/2015 | Chen ....................... H01L 22/26 156/345.29 |
| 2015/0348755 | A1 | | 12/2015 | Han |
| 2015/0371828 | A1 | | 12/2015 | Stowell |
| 2017/0207077 | A1 | | 7/2017 | Nagorny et al. |
| 2017/0301514 | A1 | | 10/2017 | Cho |
| 2018/0122638 | A1 | | 5/2018 | Jung |
| 2018/0358204 | A1 | | 12/2018 | Ma et al. |
| 2018/0358206 | A1 | | 12/2018 | Ma et al. |
| 2018/0358208 | A1 | | 12/2018 | Ma et al. |

OTHER PUBLICATIONS

Shawming Ma et al., U.S. Appl. No. 15/892,723, filed Feb. 9, 2018, Plasma Strip Tool With Multiple Gas Injection Zones.
Shawming Ma et al., U.S. Appl. No. 15/851,922, filed Dec. 22, 2017, Plasma Processing Apparatus With Post Plasma Gas Injection.
Shawming Ma et al., U.S. Appl. No. 15/888,283, filed Feb. 5, 2018, Plasma Processing Apparatus.
PCT International Preliminary Report on Patentability for corresponding PCT Application No. PCT/US2018/020103, dated Dec. 10, 2019, 11 pages.
Definition of adjacent from Merriam-Webster Dictionary (Year: 2019)—1 page.
Merriam Webster Dictionary definition of Flaring accessed from https://www.merriam-webster.com/dictionary/flaring on Mar. 25, 2020—1 page.

* cited by examiner

PLASMA STRIP TOOL WITH UNIFORMITY CONTROL

PRIORITY CLAIM

The present application claims the benefit of priority of U.S. Provisional Patent Application No. 62/610,588, entitled "Plasma Strip Tool with Uniformity Control," filed on Dec. 27, 2017, which is incorporated herein by reference. The present application claims the benefit of priority of U.S. Provisional Patent Application No. 62/517,365, entitled "Plasma Strip Tool with Uniformity Control," filed on Jun. 9, 2017, which is incorporated herein by reference for all purposes.

FIELD

The present disclosure relates generally to apparatus, systems, and methods for processing one or more substrates using a plasma source

BACKGROUND

Plasma processing is widely used in the semiconductor industry for deposition, etching, resist removal, and related processing of semiconductor wafers and other substrates. Plasma sources (e.g., microwave, ECR, inductive, etc.) are often used for plasma processing to produce high density plasma and reactive species for processing substrates. Plasma strip tools can be used for strip processes, such as photoresist removal. Plasma strip tools can include one or more plasma chambers where plasma is generated and one or more separate processing chambers where the one or more substrates are processed. The one or more processing chambers can be "downstream" of the one or more plasma chambers such that there is no direct exposure of the one or more substrate to the plasma. Separation grid(s) can be used to separate the one or more processing chambers from the one or more plasma chambers. The separation grids can be transparent to neutral species but not transparent to charged particles from the plasma. The one or more separation grids can include a sheet of material with holes.

Uniformity control in plasma strip tools can be important for improved performance (e.g., improved ash rate performance). Uniformity can be difficult to tune in a plasma strip tool without manipulating process parameters, such gas pressure and flow, and RF power provided to induction coils used to generate the plasma. Uniformity control can be particularly important when matching performance parameters of separate plasma processing heads in plasma strip tool having a plurality of plasma processing heads, such as a twin chamber plasma strip tool.

SUMMARY

Detailed discussion of embodiments directed to one of ordinary skill in the art are set forth in the specification, which makes reference to the appended figures, in which:

One example aspect of the present disclosure is directed to a plasma processing apparatus. The apparatus includes a processing chamber. The apparatus includes a first pedestal in the processing chamber operable to support a workpiece. The first pedestal can define a first processing station. The plasma processing apparatus can include a second pedestal in the processing chamber operable to support a workpiece. The second pedestal can define a second processing station. The apparatus can include a first plasma chamber disposed above the first processing station. The first plasma chamber can be associated with a first inductive plasma source. The first plasma chamber can be separated from the processing chamber by a separation grid. The apparatus can include a second plasma chamber disposed above the second processing station. The second plasma chamber can be associated with a second inductive plasma source. The second plasma chamber can be separated from the processing chamber by a separation grid.

Other example aspects of the present disclosure are directed to systems, methods, processes, apparatus, and devices for plasma strip tool uniformity.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
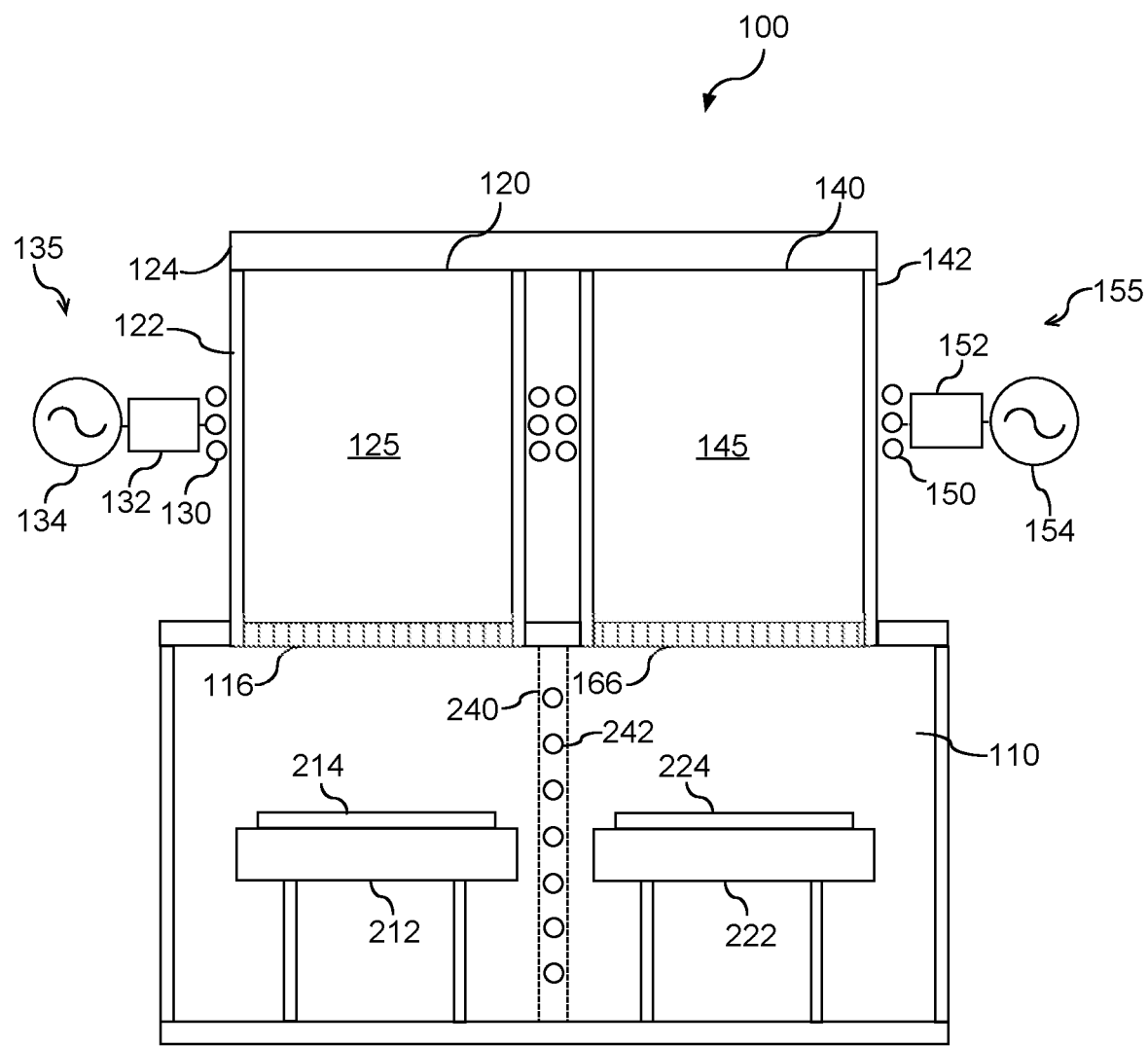
FIG. 1 depicts an example twin chamber plasma processing apparatus according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to uniformity control in a plasma processing apparatus, such as a plasma strip tool. In some embodiments, aspects of the present disclosure can be used to improve uniformity in plasma strip tools with multiple processing stations (e.g., capable of processing multiple workpieces), such as in twin chamber strip tools.

For instance, a plasma processing apparatus can include a processing chamber and at least two plasma chambers (e.g., a first plasma chamber and a second plasma chamber). The processing chamber can include a first pedestal (e.g., pedestal) defining a first processing station for a workpiece and a second pedestal defining a second processing station for a workpiece. In some embodiments, the first pedestal and/or the second pedestal do not include an electrostatic chuck.

A first plasma chamber for generating a plasma can be disposed above the first processing station. A second plasma chamber for generating a plasma can be disposed above the second processing station. The first plasma chamber can be associated with a first inductive plasma source (e.g., an induction coil) that when energized with RF energy generates a plasma in a process gas in the first plasma chamber. The second plasma chamber can be associated with a second inductive plasma source (e.g., an induction coil) that when energized with RF energy generates a plasma in a process gas in the second plasma chamber.

Ions and radicals generated in the plasma in the first plasma chamber can be passed through a separation grid. The separation grid can filter out the ions and allow passage of neutral particles for exposure to a workpiece at the first processing station to perform a surface treatment process, such as a photoresist removal. Similarly, ions and radicals generated in the plasma in the second plasma chamber can be passed through a separation grid. The separation grid can filter out the ions and allow passage of neutral particles for exposure to a workpiece at the second processing station to perform a surface treatment process, such as photoresist removal.

Example embodiments of the present disclosure can be used to provide uniformity tunability in a plasma strip tool using features that can provide for one or more of tunability of radial uniformity, azimuthal uniformity, and/or vertical uniformity. Radial uniformity can refer to uniformity in a radial direction extending between a center portion of a workpiece processed in the plasma processing apparatus to a peripheral portion of a workpiece processed in the plasma processing apparatus. Azimuthal uniformity can refer to process uniformity at different azimuthal positions around a workpiece processed in the plasma processing apparatus. Vertical tunability can refer to the ability to affect process uniformity through vertical movement of a workpiece in the processing chamber of a plasma processing apparatus.

Azimuthal uniformity can be difficult to address in certain multi-chamber (e.g., twin chamber) plasma processing apparatus designs. For instance, as discussed above, a twin chamber plasma processing apparatus can include a common pedestal with two different processing portions for workpiece temperature regulation. Due to extra thermal mass in between the processing portions between the substrates, azimuthal uniformity can be difficult to adjust.

According to example aspects of the present disclosure, azimuthal uniformity can be improved using individual pedestals (e.g., heating pedestals) for the substrates. A common pressure equalizing baffle can be provided in conjunction with the individual heating pedestals for azimuthal uniformity improvement. In some embodiments, bottom concentric individual pumping with a common pump can be used in conjunction with individual heating pedestals for azimuthal uniformity improvement. In some embodiments, for instance, azimuthal uniformity can be implemented by rotating a pedestal supporting a substrate during processing of the substrate (e.g., during a strip process).

According to example aspects of the present disclosure, radial uniformity can be tuned, for instance, using a pedestal with a plurality of independent temperature regulation zones. Each temperature regulation zone can include one or more heating elements for heating a workpiece. In addition and/or in the alternative, each temperature regulation zone can include one or more cooling channels for circulating a fluid (e.g., a gas, water, cooling fluid, etc.) to cool the workpiece. In some embodiments, the pedestal may not include an electrostatic chuck.

In some embodiments, a pedestal used to support a substrate in the processing chamber of the plasma processing apparatus can include multiple temperature regulations zones with each zone used to control heating and/or cooling of a different radial and/or azimuthal portion of the workpiece. For instance, a heating element located within each zone can be independently controlled to affect uniformity of the strip process in the plasma processing apparatus. In some embodiments, the pedestal can have a center temperature regulation zone and a peripheral temperature regulation zone. In some embodiments, the pedestal can have three or more radially separated temperature regulation zones. In some embodiments, the pedestal can be divided azimuthally into quadrants or other subdivision to provide multiple temperature regulation zones. More or fewer temperature regulation zones can be used without deviating from the scope of the present disclosure.

In some embodiments, uniformity can be vertically tuned by adjusting the distance between the workpiece and the plasma chamber or separation grid in a plasma processing apparatus. For instance, a pedestal supporting the substrate can be moved in a vertical direction to adjust the distance between the workpiece and the separation grid. In addition and/or in the alternative, the height of one or more lift pins supporting the substrate can be adjusted to control the distance between the separation grid and the workpiece.

A twin chamber plasma processing apparatus can include a common top plate located above two separate plasma chambers (e.g., plasma heads) for plasma generation. In some embodiments, the top plate can include a symmetric temperature regulation system. The symmetric temperature regulation system can include one or more heating elements and/or one or more cooling channels. According to example aspects of the present disclosure, a symmetric temperature regulation system can be employed to reduce a top plate temperature difference between the two plasma chambers. In some embodiments, each plasma chamber can be associated with its own temperature regulation system to enhance uniformity between the plasma sources.

One example embodiments of the present disclosure is directed to a plasma processing apparatus. The apparatus includes a processing chamber. The apparatus includes a first pedestal in the processing chamber operable to support a workpiece. The first pedestal defines a first processing station. The apparatus includes a second pedestal in the processing chamber operable to support a workpiece. The second pedestal defines a second processing station. The apparatus includes a first plasma chamber disposed above the first processing station. The apparatus includes a second plasma chamber disposed above the second processing station.

In some embodiments, the processing chamber can have a wall separating the first pedestal from the second pedestal. In some embodiments, the wall can include a wall temperature regulation system. The wall temperature regulation system can include one or more heating elements and/or one or more cooling channels. The first pedestal and the second pedestal can each have their own independent processing chamber. In some embodiments, the plasma processing apparatus can include a pressure equalizing baffle operable to maintain pressure between the first processing station and the second processing station.

In some embodiments, the apparatus includes a first concentric pump port located beneath the first pedestal. The apparatus includes a second concentric pump port located beneath the second pedestal. The plasma processing apparatus can include a common pump coupled to the first concentric pump port and the second concentric pump port.

In some embodiments, the apparatus includes a first separation grid separating the first plasma chamber from the processing chamber. The apparatus includes a second separation grid separating the second plasma chamber from the processing chamber. In some embodiments, the apparatus includes a common separation grid separating both the first plasma chamber and the second plasma chamber from the processing chamber.

In some embodiments, the plasma processing apparatus includes a top plate disposed above the first plasma chamber and the second plasma chamber. The top plate comprises a symmetric temperature regulation system between the first plasma chamber and the second plasma chamber.

In some embodiments, at least one of the first pedestal or the second pedestal includes a plurality of independent temperature regulation zones. The plurality of independent temperature regulation zones can include a plurality of radially divided zones (e.g., a center zone and a peripheral zone). The plurality of temperature regulation zones can include a plurality of azimuthally divided zones (e.g., quadrants).

In some embodiments, at least one of the first pedestal or the second pedestal are movable in a vertical direction to adjust a vertical position of a workpiece relative to a separation grid. In some embodiments, at least one of the first pedestal or the second pedestal include one or more lift pins operable to adjust a vertical position of a workpiece relative to a separation grid.

Another example embodiment of the present disclosure is directed to a top plate for a plasma strip tool comprising a first plasma chamber and a second plasma chamber. The top plate includes a symmetric cooling channel. The symmetric cooling channel includes an inlet in a central portion of the top plate between a first portion associated with the first plasma chamber and a second portion of the top plate associated with the second plasma chamber. The cooling channel includes one or more outlets located proximate the inlet between the first portion and the second portion. In some embodiments, the symmetric cooling channel includes a common channel that passes between the first portion of the top plate and the second portion of the top plate.

Another example embodiment of the present disclosure is directed to a plasma strip tool. The tool includes a processing chamber. The tool includes a first pedestal in the processing chamber operable to support a workpiece. The first pedestal defines a first processing station. The tool includes a second pedestal in the processing chamber operable to support a workpiece. The second pedestal defines a second processing station. The tool includes a first plasma chamber disposed above the first processing station. The tool includes a second plasma chamber disposed above the second processing station. The tool includes a first separation grid separating the first plasma chamber from the processing chamber. The tool includes a second separation grid separating the second plasma chamber from the processing chamber. The tool includes a first inductive plasma source operable to generate a plasma in the first plasma chamber. The tool includes a second inductive plasma source operable to generate a plasma in the second plasma chamber. The tool includes a first concentric pump port located beneath the first pedestal. The tool includes a second concentric pump port located beneath the second pedestal.

In some embodiments, the tool includes a common pump coupled to the first concentric pump port and the second concentric pump port. In some embodiments, the tool includes a wall separating the first pedestal and the second pedestal. The wall can include a temperature regulation system. In some embodiments, the tool includes a top plate coupled to the first plasma chamber and the second plasma chamber. The top plate can include a symmetric cooling channel.

Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within 10% of the stated numerical value. In addition, the terms "plasma chamber" and "plasma head" are intended to be used interchangeably herein. The term "pedestal" refers to any structure used to support a workpiece. In some embodiments, a pedestal does not include an electrostatic chuck.

With reference now to the FIGS., example embodiments of the present disclosure will now be set forth. The example embodiments are discussed herein with respect to a twin chamber plasma processing apparatus having two plasma chambers connected to a single processing chamber having two pedestals. Those of ordinary skill in the art will understand that various configurations of plasma processing apparatus can be used in accordance with the present disclosure. For example, plasma processing apparatus having more than two plasma chambers, such as three plasma chambers, four plasma chambers, or any other suitable number of plasma chambers can be used in accordance with the present disclosure. Additionally, and/or alternatively, plasma processing apparatus having more than one processing chamber can be used in accordance with the present disclosure. For example, a plasma processing apparatus having a plurality of processing chambers each with an associated plasma chamber can be used in accordance with the present disclosure. As another example, a plurality of processing chambers each having a plurality of associated plasma chambers can be used in accordance with the present disclosure. As another example, a processing chamber having more than two can be used in accordance with the present disclosure.

FIG. 1 depicts an example multi-chamber plasma processing apparatus 100 according to example embodiments of the present disclosure. The processing apparatus 100 includes a processing chamber 110 and a first plasma chamber 120 (e.g., first plasma head) that is separate from the processing chamber 110. The plasma processing apparatus 100 can include a second plasma chamber 140 (e.g., second plasma head) that can be substantially identical to the first plasma chamber 120. A top cap 124 can be disposed above the first plasma chamber 120 and the second plasma chamber 140.

The first plasma chamber 120 can include a dielectric sidewall 122. The top plate 124 and dielectric sidewall 124 can form a first plasma chamber interior 125. Dielectric sidewall 122 can be formed from any suitable dielectric material, such as quartz.

The plasma processing apparatus 100 can include a first inductively coupled plasma source 135 configured to generate a plasma in a process gas provided to the first plasma chamber interior 125. The first inductively coupled plasma source 135 can include induction coil 130 disposed about the dielectric sidewall 122. The induction coil 130 can be coupled to an RF power generator 134 through a suitable matching network 132. Reactant and/or carrier gases can be provided to the chamber interior from a gas supply (not illustrated). When the induction coil 130 is energized with RF power from the RF power generator 134, a substantially inductive plasma is induced in the first plasma chamber interior 125. In some embodiments, the first plasma chamber 120 can include a grounded Faraday shield to reduce capacitive coupling of the induction coil 130 to the plasma.

The second plasma chamber 140 can include a dielectric sidewall 142. The top plate 124 and dielectric sidewall 142 can form a second plasma chamber interior 145. Dielectric sidewall 142 can be formed from any suitable dielectric material, such as quartz.

The plasma processing apparatus 100 can include a second inductively coupled plasma source 155 configured to generate a plasma in a process gas provided to the second plasma chamber interior 145. The second inductively coupled plasma source 155 can include induction coil 150 disposed about the dielectric sidewall 142. The induction coil 150 can be coupled to an RF power generator 154 through a suitable matching network 152. Reactant and/or carrier gases can be provided to the chamber interior 145 from a gas supply (not illustrated). When the induction coil 150 is energized with RF power from the RF power generator 154, a substantially inductive plasma is induced in the second plasma chamber interior 145. In some embodiments, the second plasma chamber 150 can include a grounded Faraday shield to reduce capacitive coupling of the induction coil 150 to the plasma.

A first separation grid 116 can separate the first plasma chamber 120 from the processing chamber 110. The first separation grid 116 can be used to perform ion filtering of particles generated by plasma in the first plasma chamber 120. Particles passing through the first separation grid 116 can be exposed to a workpiece (e.g., a semiconductor wafer) in the processing chamber for surface treatment of the workpiece (e.g., photoresist removal).

More particularly, in some embodiments, the first separation grid 116 can be transparent to neutral species but not transparent to charged particles from the plasma. For example, charged particles or ions can recombine on walls of the first separation grid 116. The first separation grid 116 can include one or more grid plates of material with holes distributed according to a hole pattern for each sheet of material. The hole patterns can be the same or different for each grid plate.

For example, the holes can be distributed according to a plurality of hole patterns on a plurality of grid plates arranged in a substantially parallel configuration such that no hole allows for a direct line of sight between the plasma chamber and the processing chamber to, for example, reduce or block UV light. Depending on the process, some or all of the grid can be made of a conductive material (e.g., Al, Si, SiC, etc.) and/or non-conductive material (e.g., quartz, etc.). In some embodiments, if a portion of the grid (e.g. a grid plate) is made of a conductive material, the portion of the grid can be grounded.

A second separation grid 166 can separate the second plasma chamber 140 from the processing chamber 110. The second separation grid 166 can be used to perform ion filtering of particles generated by plasma in the second plasma chamber 140. Particles passing through the second separation grid 166 can be exposed to a workpiece (e.g., a semiconductor wafer) in the processing chamber for surface treatment of the workpiece (e.g., photoresist removal).

More particularly, in some embodiments, the second separation grid 166 can be transparent to neutral species but not transparent to charged particles from the plasma. For example, charged particles or ions can recombine on walls of the second separation grid 166. The second separation grid 166 can include one or more grid plates of material with holes distributed according to a hole pattern for each sheet of material. The hole patterns can be the same or different for each grid plate.

For example, the holes can be distributed according to a plurality of hole patterns on a plurality of grid plates arranged in a substantially parallel configuration such that no hole allows for a direct line of sight between the plasma chamber and the processing chamber to, for example, reduce or block UV light. Depending on the process, some or all of the grid can be made of a conductive material (e.g., Al, Si, SiC, etc.) and/or non-conductive material (e.g., quartz, etc.). In some embodiments, if a portion of the grid (e.g. a grid plate) is made of a conductive material, the portion of the grid can be grounded.

Figure 2:
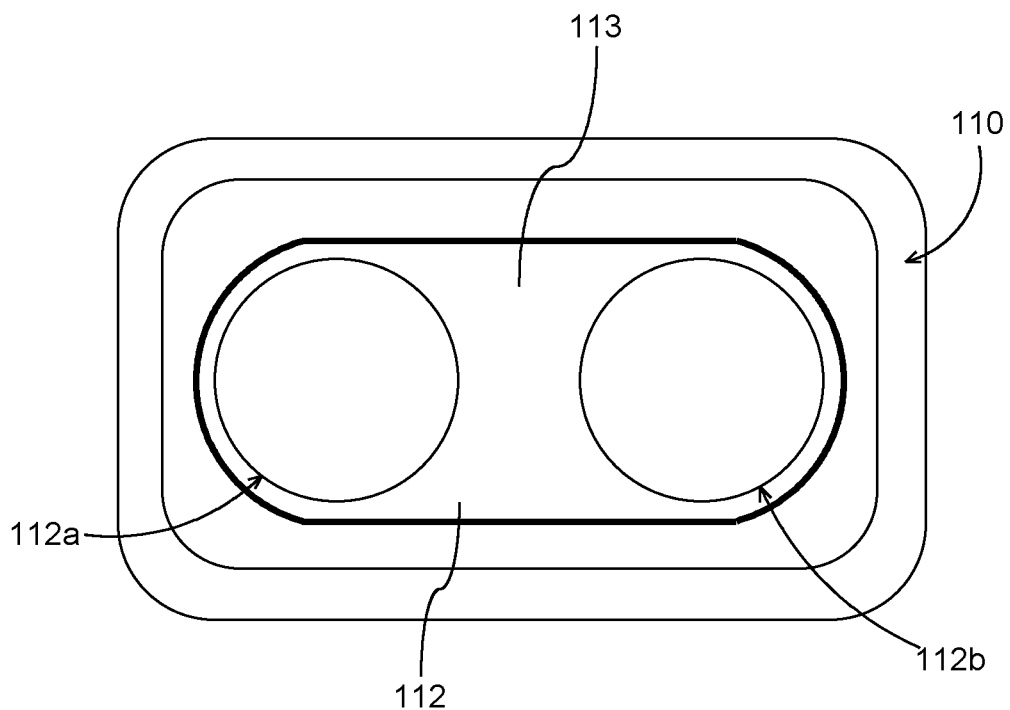
FIG. 2 depicts a plan view of an example processing chamber of a twin chamber plasma processing apparatus.

The processing chamber 110 can include one or more pedestals (e.g., substrate holders) operable to hold one or more workpieces during processing. FIG. 2 depicts a plan view of a common heating pedestal 112 that can be used in a multi-chamber plasma processing apparatus The common heating pedestal 112 can include two processing stations 112a and 112b for processing workpieces. The common heating pedestal 112 can make it difficult to tune azimuthal uniformity of workpieces at processing stations 112a and 112b due to the extra thermal mass 113 of the pedestal 112 between the processing stations 112a and 112b.

To improve azimuth uniformity, a processing chamber 110 according to example aspects of the present disclosure can include a first pedestal 212 (e.g., a heated pedestal) defining a first processing station for supporting a first workpiece 214 beneath the first plasma chamber 120 for processing the workpiece 214. The processing chamber 110 can include a second pedestal 222 (e.g., heated pedestal) defining a second processing station for supporting a second workpiece 224 beneath the second plasma chamber 140 for processing the workpiece 224 at a second processing station. The first pedestal 212 is separated from the second pedestal 222 such that there is no solid mass connecting the first pedestal 212 and the second pedestal 222.

In some embodiments, an optional wall 240 can separate the first pedestal 212 and the second pedestal 222. The wall 240 can include a wall temperature regulation system 242. The wall temperature regulation system 242 can include one or more heating elements. The wall temperature regulation system 242 can include one or more cooling channels operable to circulate fluid through the wall.

The use of independent pedestals 212 and 222 can reduce azimuthal non-uniformities resulting from use of a common heating pedestal 112. In some embodiments, the pedestals 212 and 222 do not include an electrostatic chuck.

Figure 3:
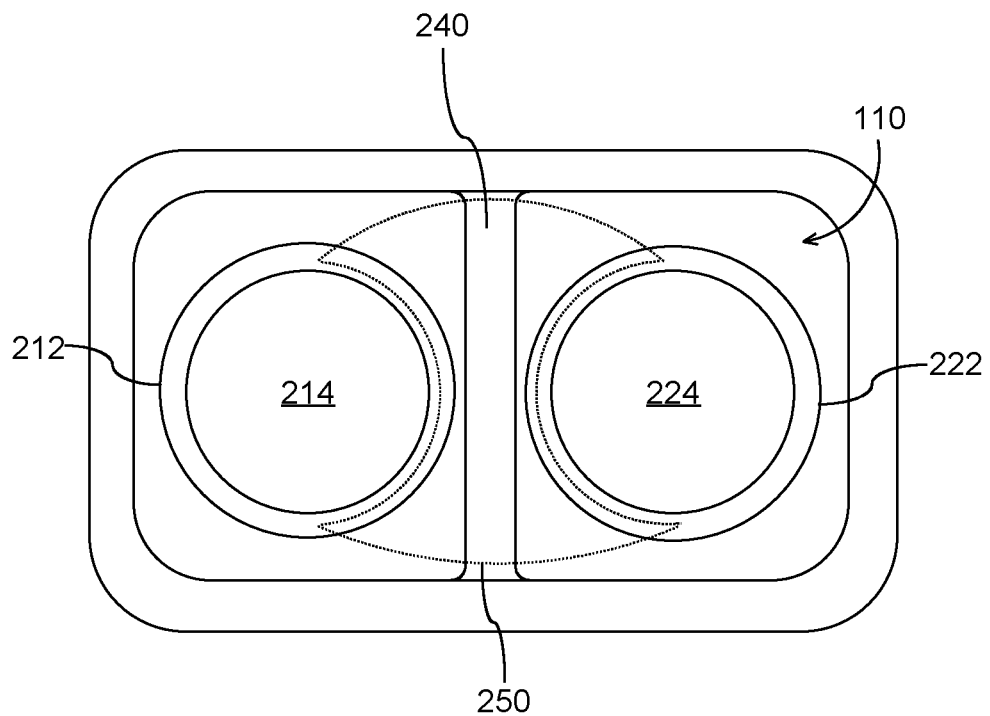
FIG. 3 depicts a plan view of an example processing chamber of a twin chamber plasma processing apparatus according to example embodiments of the present disclosure.

FIG. 3 depicts a plan view of an example processing chamber 110 including a first pedestal 212 and a second pedestal 222 according to example embodiments of the present disclosure. The first pedestal 212 can be associated with a first processing station for a workpiece 214. The second pedestal 222 can be associated with a second processing station for workpiece 224. The first pedestal 212 and the second pedestal 222 can each be associated with its own independent respective plasma chamber (e.g., plasma head). The first pedestal 212 and the second pedestal 222 can be located in the same processing chamber 110. A common pump port can be associated with the processing chamber 110. A pressure equalizing baffle 250 can be used to maintain pressure in the processing chamber 110.

Figure 4:
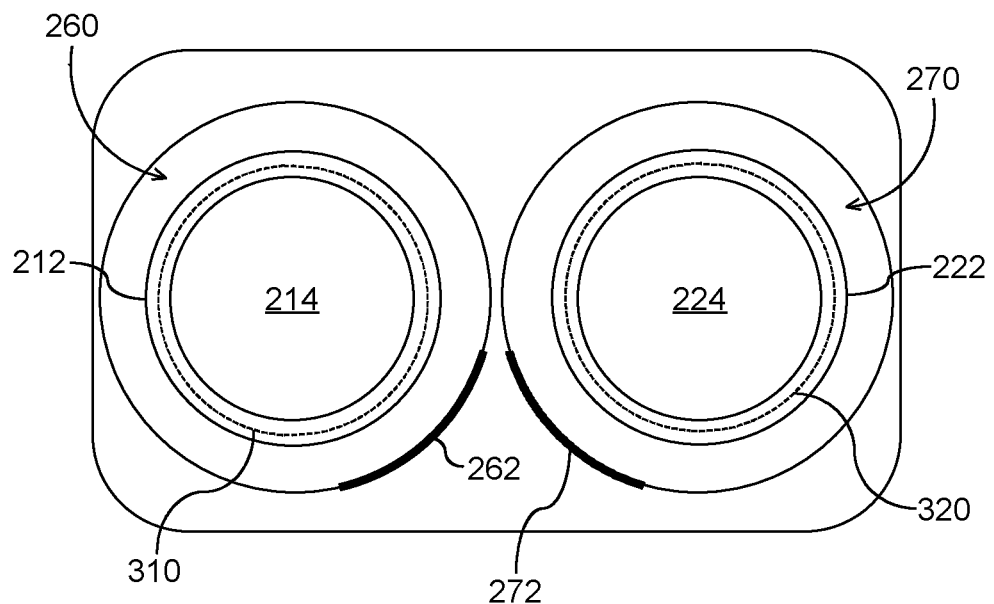
FIG. 4 depicts a plan view of an example twin chamber plasma processing apparatus according to example embodiments of the present disclosure.
Figure 5:
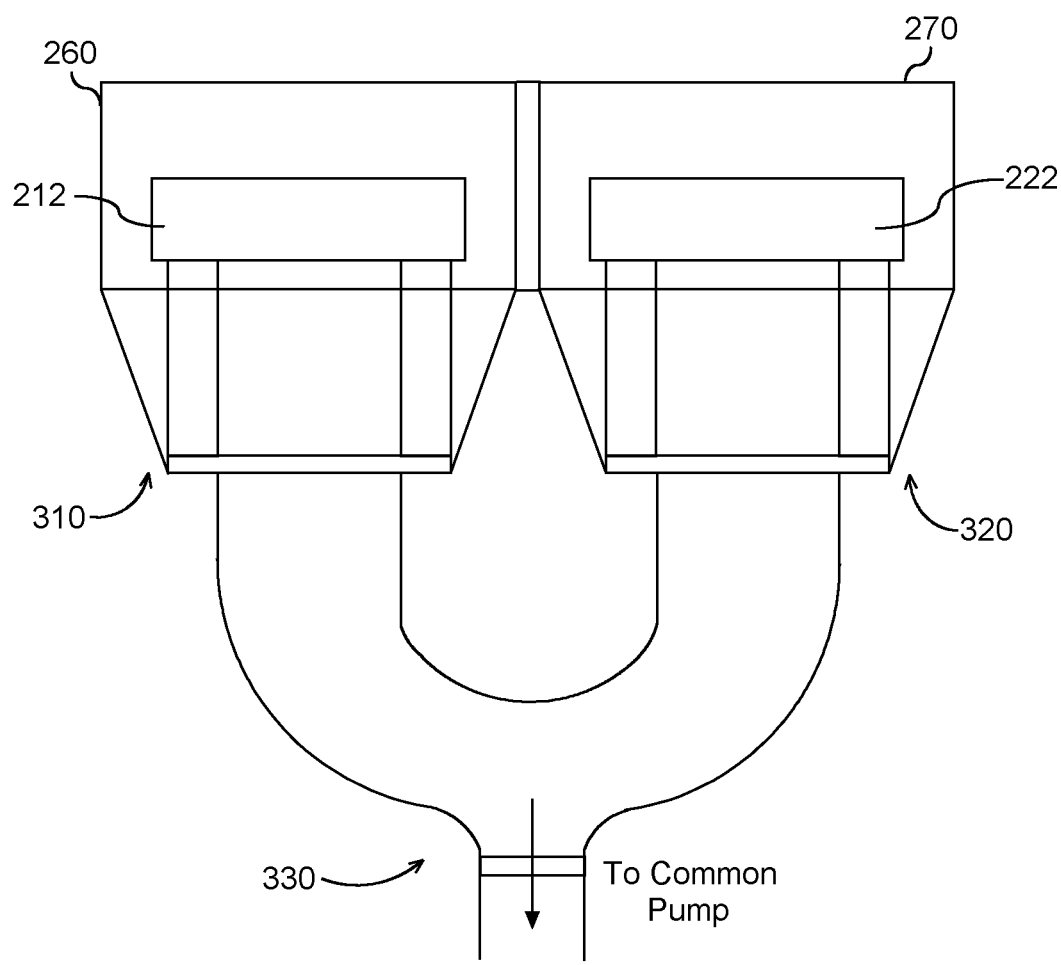
FIG. 5 depicts a plan view of an example twin chamber plasma processing apparatus according to example embodiments of the present disclosure.

FIGS. 4 and 5 depict an example plasma processing apparatus with independent pedestals according to example embodiments of the present disclosure. The first pedestal 212 can be associated with a first processing station. The second pedestal 222 can be associated with a second processing station. The first pedestal 212 and the second pedestal 222 can each be associated with its own independent respective plasma chamber (e.g., plasma head). The first pedestal 212 and the second pedestal 222 can be disposed in separate processing chambers. For instance, first pedestal 212 can be disposed in first processing chamber 260. The second pedestal 222 can be disposed in second processing chamber 270. The first processing chamber 260 can have chamber walls and a slit door 262 to allow placement of a workpiece on the pedestal 212. The second processing chamber 270 can have chamber walls and a slit door 272 to allow placement of a substrate on the second pedestal 222.

A first pump port 310 (e.g., a concentric pump port) can be located beneath the first pedestal 212. A second pump port 320 (e.g., a concentric pump port) can be located beneath the second pedestal 222. As shown in FIG. 5, the first pump port 310 and the second pump port 320 can be coupled to a common plenum 330 having a pump. In this way, the pump port 310 and the pump port 320 can be coupled to a common pump.

Figure 6A:
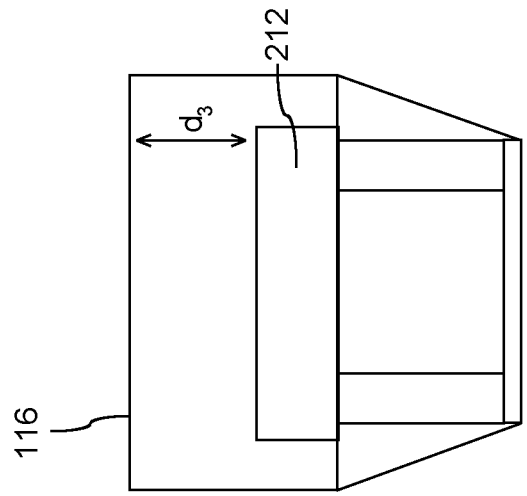
FIGS. 6(a), 6(b) and 6(c) depicts example vertical positioning of a pedestal to adjust a distance between a separation grid and a substrate in a plasma processing apparatus according to example embodiments of the present disclosure.
Figure 6B:
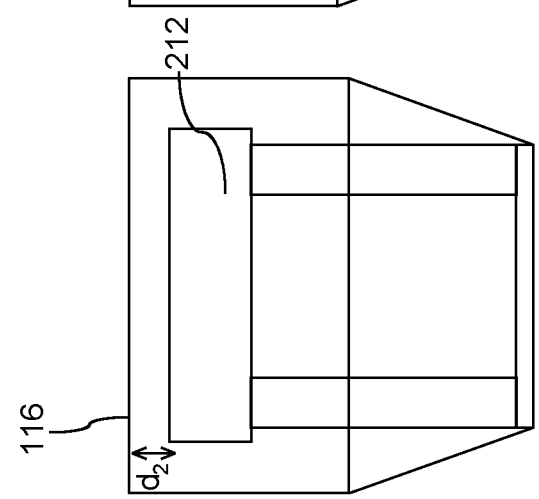
Figure 6C:
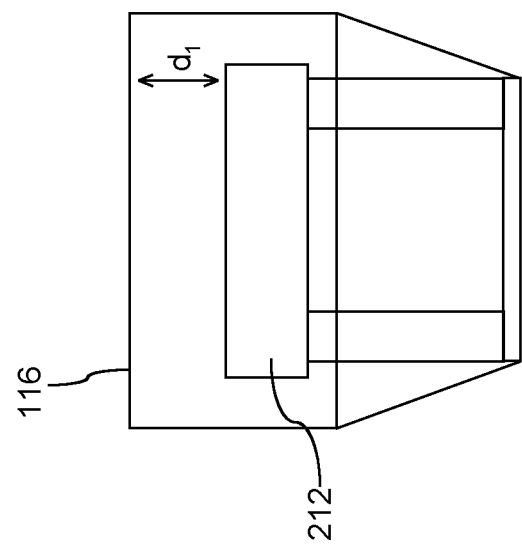

In some embodiments, a plasma processing apparatus can have features for vertical tunability of process uniformity. FIGS. 6(a)-6(c) depict example vertical positioning of a pedestal to adjust a distance between a separation grid/plasma chamber and a workpiece in a plasma processing apparatus according to example embodiments of the present disclosure. In FIG. 6(a), the pedestal 212 is positioned in a first vertical position so that the workpiece is a first distance d1 from the separation grid 116/plasma chamber. The position of the pedestal 212 shown in FIG. 6(a) can be associated with a workpiece loading operation. In FIG. 6(b), the pedestal 212 is positioned in a second vertical position so that the workpiece is a second distance d2 (e.g., no more than 2 mm) from the separation grid 116/plasma chamber. The second distance d2 can be less than the first distance d1. In FIG. 6(c), the pedestal 212 is in a third vertical position so that the workpiece is a third distance d3 from the separation grid. The third distance d3 can be greater the first distance d1 and the second distance d2. Other vertical positions are within the scope of the present disclosure.

Figure 7A:
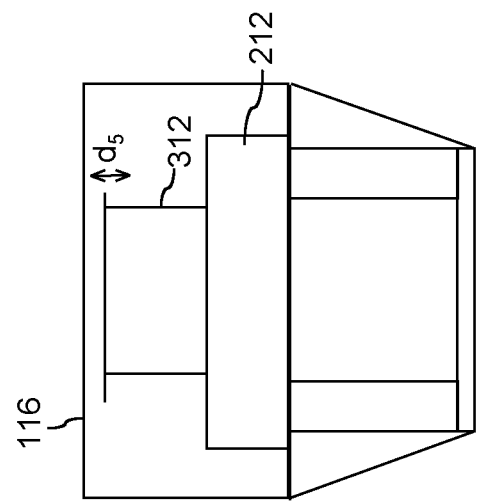
FIGS. 7(a) and 7(b) depicts example vertical positioning of one or more lift pins to adjust a distance between a separation grid and a substrate in a plasma processing apparatus according to example embodiments of the present disclosure.
Figure 7B:
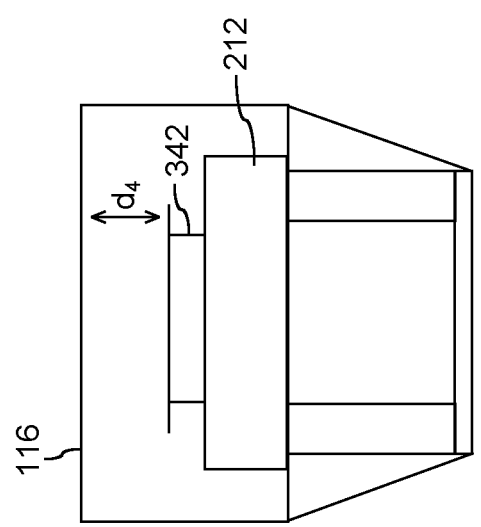

FIGS. 7(a)-7(b) depict example vertical positioning of one or more lift pins to adjust a distance between a separation grid/plasma source and a workpiece in a plasma processing apparatus according to example embodiments of the present disclosure. In FIG. 7(a), the lift pin(s) 342 can be in a first vertical position so that the workpiece is a first distance d4 from the separation grid 116/plasma source. The position of the workpiece shown in FIG. 7(a) can be associated with a workpiece loading operation. In FIG. 7(b), the lift pin(s) 342 can be in a second vertical position so that the workpiece is a second distance d2 from the separation grid 116/plasma source. The second distance d2 can be less than the first distance d1. Other vertical positions are within the scope of the present disclosure.

In some embodiments, each pedestal can be used to control the temperature of the workpiece during processing. The temperature of the workpiece can be controlled, for instance, to be in the range of about 20 degrees Celsius to about 450 degrees Celsius.

In some embodiments, any of the pedestals described herein can have a plurality of temperature regulations zones for tuning process uniformity. Each temperature regulation zone can include one or more heating elements and/or one or more cooling channels. The independent temperature regulation zones can be controlled to provide for temperature gradients between zones. The temperature gradient can be, for instance, about 30 degrees Celsius or less, such as about 20 degrees Celsius or less, such as about 10 degrees Celsius or less, such as about 5 degrees Celsius or less, such as about 2 degrees Celsius or less.

Figure 8:
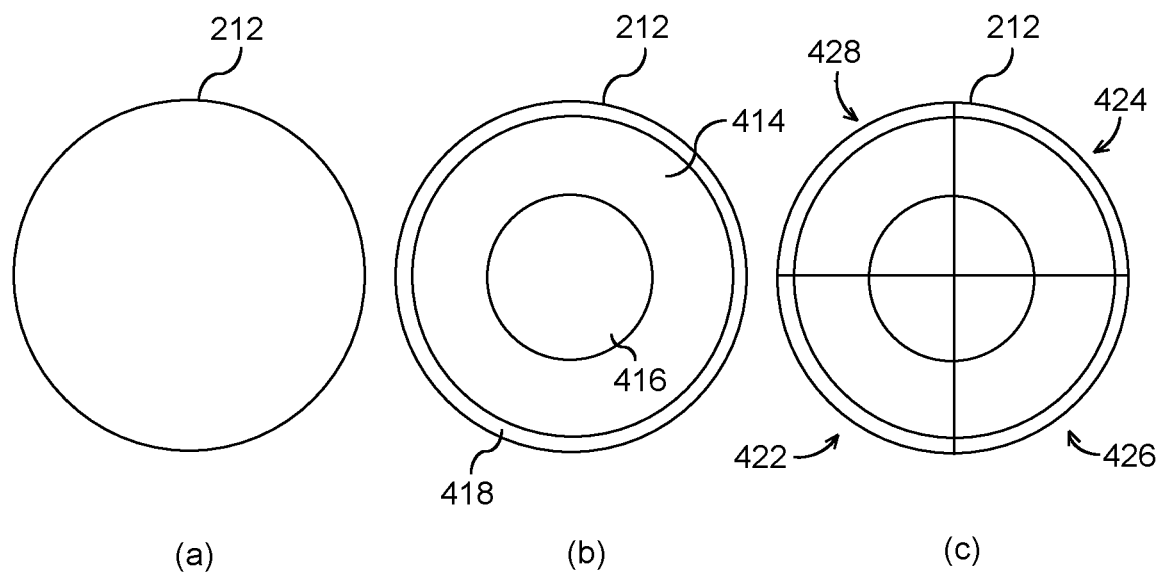
FIGS. 8(a), 8(b) and 8(c) depict a pedestal with example independent heating zones according to example embodiments of the present disclosure.

FIGS. 8(a)-8(c) depict a pedestal 212 with example independent temperature regulation zones according to example embodiments of the present disclosure. More particularly, FIG. 8(a) depicts a pedestal 212 with a single temperature regulation zone. FIG. 8(b) depicts a pedestal 212 with three radially separated independent temperature regulation zones. More particularly, the pedestal includes a center temperature regulation zone 416 and a peripheral temperature regulation zone 414. In addition, the pedestal includes an outer temperature regulation zone 418 outside of the peripheral temperature regulation zone 414.

FIG. 8(c) depicts a pedestal 212 with three radially separated temperature regulation zones (e.g., center temperature regulation zone 416, peripheral temperature regulation zone 414, outer temperature regulation zone 418) that is also divided azimuthally into quadrants, such as first quadrant 422, second quadrant 424, third quadrant 426, and fourth quadrant 428. The division of temperature regulation zones as shown in FIG. 8(c) can result in twelve different independent temperature regulation zones. Other divisions of the pedestal in a radial fashion and/or an azimuthal fashion or other manner are within the scope of the present disclosure.

Example aspects of the present disclosure are directed to a top cap for a multi-chamber plasma processing apparatus with more uniform cooling. The top cap can include a symmetric temperature regulation system (e.g., a cooling channel) to provide for improved uniformity between processing chambers.

Figure 9:
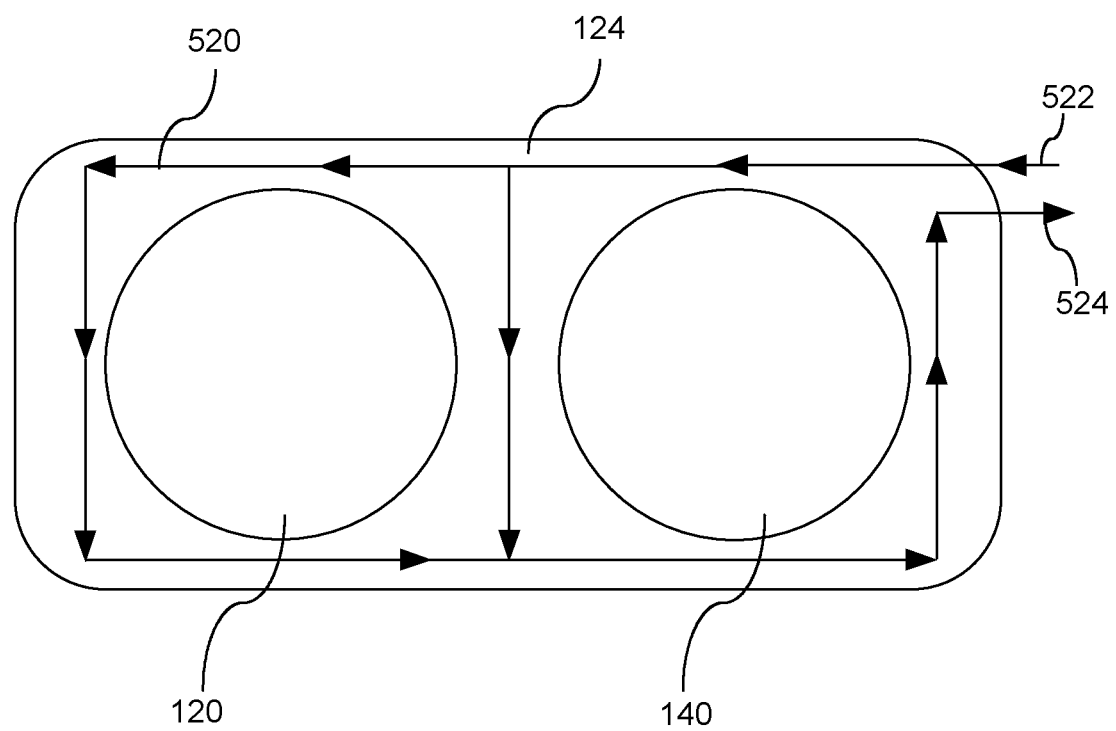
FIG. 9 depicts a top plate for a twin chamber plasma processing apparatus.

More particularly, FIG. 9 depicts a cooling channel 520 for circulating a cooling fluid through a top plate 124 of a twin chamber plasma processing apparatus having a first plasma chamber 120 and a second plasma chamber 140. As shown, the inlet 522 and outlet 524 of the cooling channel 520 is located proximate the second plasma chamber 140. Because the cooling fluid (e.g., water or other cooling fluid) circulating through the channel 520 may be warmed by the second plasma chamber 140 prior to reaching the portion of the top plate 124 associated with the first plasma chamber 120, the portion of the top plate 124 associated with the first plasma chamber 120 may be warmer than the portion of the top plate 124 associated with the second plasma chamber 140.

Figure 10:
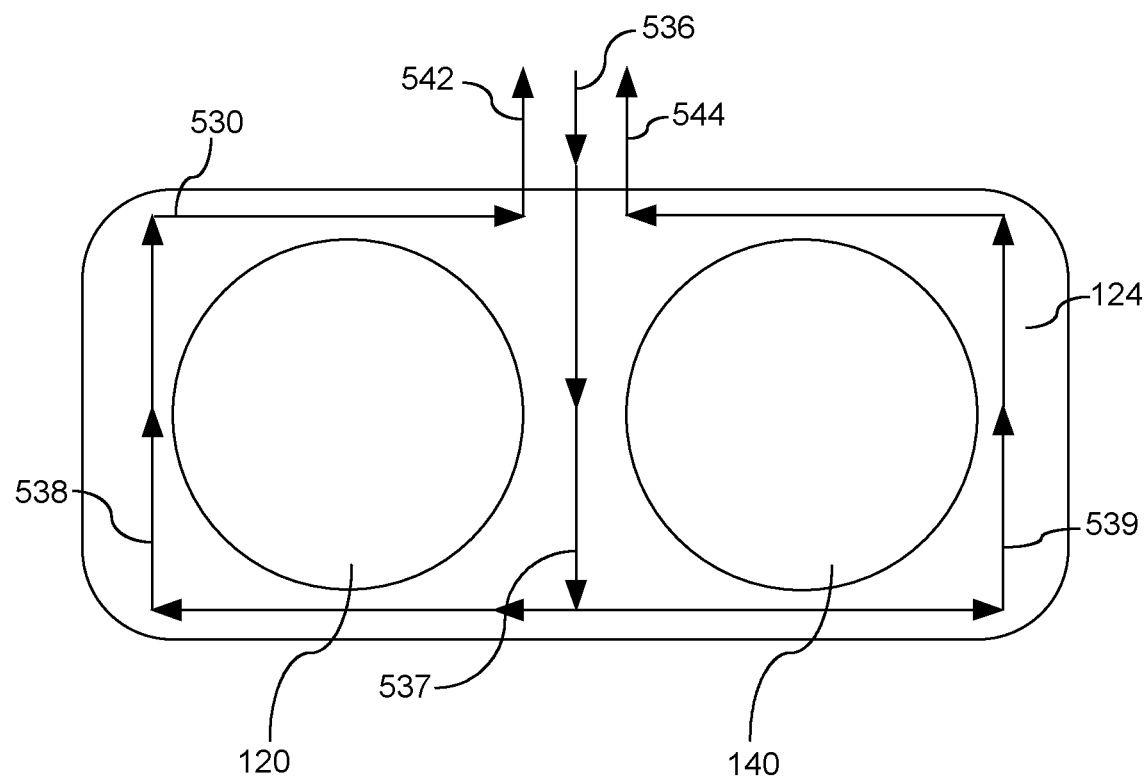
FIG. 10 depicts a top plate for a twin chamber plasma processing apparatus according to example embodiments of the present disclosure.

FIG. 10 depicts a cooling channel 530 for circulating a cooling fluid through a top plate 124 of a twin chamber plasma processing apparatus according to example embodiments of the present disclosure. As illustrated, the top plate 124 includes a symmetric cooling channel 530 (e.g. symmetric about an axis passing between the first plasma chamber 120 and the second plasma chamber 140). The symmetric cooling channel 530 includes an inlet 536 located in a central portion of the top plate 124 between the first plasma chamber 120 and the second plasma chamber 140. The channel 530 includes a common portion 537 that passes between the first plasma chamber 120 and the second plasma chamber 140. The channel 530 includes a first branch 538 that extends from the common portion 537 around the first plasma chamber 120 to a first outlet 542. The first outlet 542 can be located between the first plasma chamber 120 and the second plasma chamber 140. The channel 530 includes a second branch 539 that extends from the common portion 537 around the second plasma chamber 140 a second outlet 544. The second outlet 544 can be located between the first plasma chamber 120 and the second plasma chamber 140. The first outlet 542 and/or the second outlet 544 can be located proximate to the inlet 536 for the channel 530.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A plasma processing apparatus, comprising:
a processing chamber;
a first pedestal in the processing chamber operable to support a workpiece, the first pedestal defining a first processing station;
a second pedestal in the processing chamber operable to support a workpiece, the second pedestal defining a second processing station;
a wall disposed within the processing chamber such that the first pedestal is separated from the second pedestal via the wall;
a first plasma chamber disposed above the first processing station, the first plasma chamber associated with a first inductive plasma source, the first plasma chamber separated from the processing chamber by a first separation grid;
a second plasma chamber disposed above the second processing station, the second plasma chamber associated with a second inductive plasma source, the second plasma chamber separated from the processing chamber by a second separation grid;
a temperature regulation system disposed within the wall; and
a top plate disposed above the first plasma chamber and the second plasma chamber, the top plate comprising a symmetric temperature regulation system comprising a cooling channel having a common channel, the common channel comprising a first end and a second end, the first end of the common channel having an inlet portion, the cooling channel comprising a first branch extending from the second end of the common channel around the first plasma chamber and a second branch extending from the second end of the common channel around the second plasma chamber, the cooling channel having an inlet for the inlet portion of the common channel, the inlet being positioned between the first plasma chamber and the second plasma chamber when the top plate is positioned on the plasma strip tool processing apparatus.

2. The plasma processing apparatus of claim 1, wherein the temperature regulation system comprises one or more heating elements.

3. The plasma processing apparatus of claim 1, wherein the temperature regulation system comprises one or more cooling channels.

4. The plasma processing apparatus of claim 1, further comprising:
a pressure equalizing baffle connected to the first pedestal and the second pedestal, the pressure equalizing baffle operable to maintain pressure between the first processing station and the second processing station.

5. The plasma processing apparatus of claim 1, further comprising:
a first concentric pump port located beneath the first pedestal; and
a second concentric pump port located beneath the second pedestal.

6. The plasma processing apparatus of claim 5, further comprising:
a common pump coupled to the first concentric pump port and the second concentric pump port.

7. The plasma processing apparatus of claim 1, wherein at least one of the first pedestal or the second pedestal comprise a plurality of independent temperature regulation zones.

8. The plasma processing apparatus of claim 7, wherein each of the plurality of independent temperature regulation zones comprise one or more heating elements.

9. The plasma processing apparatus of claim 7, wherein each of the plurality of independent temperature regulation zones comprise one or more cooling channels.

10. The plasma processing apparatus of claim 7, wherein the plurality of independent temperature regulation zones are spaced apart from one another along a circumferential direction.

11. The plasma processing apparatus of claim 1, wherein at least one of the first pedestal or the second pedestal are movable in a vertical direction to adjust a vertical position of a workpiece.

12. The plasma processing apparatus of claim 1, wherein at least one of the first pedestal or the second pedestal comprise one or more lift pins operable to adjust a vertical position of a workpiece.

13. A top plate for a plasma strip tool comprising a first plasma chamber and a second plasma chamber, the top plate comprising:
a central portion disposed between a first portion of the top plate and a second portion of the top plate; and
a symmetric temperature regulation system, the symmetric temperature regulation system comprising a cooling channel having a common channel, the common channel comprising a first end and a second end, the first end of the common channel having an inlet portion, the cooling channel comprising a first branch extending from the second end of the common channel around the first plasma chamber and a second branch extending from the second end of the common channel around the second plasma chamber, the cooling channel having an inlet for the inlet portion of the common channel, the inlet being positioned in the central portion of the top plate, the cooling channel having a first outlet for the first branch and a second outlet for the second branch positioned between the first portion of the top plate and the second portion of the top plate, the first portion of the top plate being partially looped by the first branch and the second portion of the top plate being partially looped by the second branch.

* * * * *